United States Patent [19]

Murai

[11] Patent Number: 5,426,327
[45] Date of Patent: Jun. 20, 1995

[54] MOS SEMICONDUCTOR WITH LDD STRUCTURE HAVING GATE ELECTRODE AND SIDE SPACERS OF POLYSILICON WITH DIFFERENT IMPURITY CONCENTRATIONS

[75] Inventor: Ichiro Murai, Tokyo, Japan

[73] Assignee: Nippon Steel Corporation, Tokyo, Japan

[21] Appl. No.: 117,638

[22] Filed: Sep. 8, 1993

Related U.S. Application Data

[63] Continuation of Ser. No. 770,872, Oct. 4, 1991, abandoned.

[30] Foreign Application Priority Data

Oct. 5, 1990 [JP] Japan ................... 2-267751
Oct. 5, 1990 [JP] Japan ................... 2-267752

[51] Int. Cl.$^6$ ............... H01L 29/76; H01L 29/94
[52] U.S. Cl. ................. 257/408; 257/336; 257/344; 257/407
[58] Field of Search ........... 357/23.3, 23.4; 437/44; 257/344, 408, 407, 336

[56] References Cited

U.S. PATENT DOCUMENTS

| 4,727,038 | 2/1988 | Watabe et al. | 357/23.3 |
| 4,808,544 | 2/1989 | Matsui | 357/23.3 |
| 4,868,617 | 9/1989 | Chiao et al. | 357/23.3 |
| 4,971,922 | 11/1990 | Watabe et al. | 357/23.3 |
| 5,031,008 | 7/1991 | Yoshida et al. | 357/23.3 |
| 5,061,975 | 10/1991 | Inuishi et al. | 257/344 |

FOREIGN PATENT DOCUMENTS

| 63-122174 | 5/1988 | Japan | 357/23.3 |
| 63-168050 | 7/1988 | Japan | 357/23.3 |
| 1-89461 | 4/1989 | Japan | 357/23.3 |
| 1-232765 | 9/1989 | Japan | 357/23.3 |
| 1-278073 | 11/1989 | Japan | 357/23.3 |
| 2-34936 | 2/1990 | Japan | 357/23.3 |

Primary Examiner—Steven Ho Vin Loke
Attorney, Agent, or Firm—Pollock, Vande Sande & Priddy

[57] ABSTRACT

A MOS-type semiconductor device having an LDD structure. The device includes a silicon substrate of a first conductivity type. An insulating film is formed on a main surface of the silicon substrate. A gate electrode made of polycrystalline silicon containing impurities at a first concentration is formed on the insulating film. Sidewall spacers made of polycrystalline silicon containing impurities at a second concentration different from the first concentration are formed at both sides of the gate electrode. Impurity diffusion layers are formed in the main surface of the semiconductor substrate at respective regions thereof where source and drain of the MOS-type semiconductor device are to be formed. Each of the impurity diffusion layers includes a low concentration diffusion layer disposed at a first portion of one of the regions and a high concentration diffusion layer disposed at a second portion other than the first portion of the one region. The first portion extends between a first end substantially corresponding to a side of the gate electrode contiguous with one of the sidewall spacers and a second end substantially corresponding to an outer side of the one sidewall spacer remote from the side of the gate electrode so that a boundary line between the first portion and the second portion is substantially aligned with the outer side of the one sidewall spacer.

3 Claims, 2 Drawing Sheets

MOS SEMICONDUCTOR WITH LDD STRUCTURE HAVING GATE ELECTRODE AND SIDE SPACERS OF POLYSILICON WITH DIFFERENT IMPURITY CONCENTRATIONS

This application is a continuation, of application Ser. No. 07/770,872 filed on Oct. 4, 1991 now abandoned.

BACKGROUND OF THE INVENTION

1. Field of the Invention

The present invention relates to a MOS type semiconductor device having a lightly doped drain (LDD) structure.

2. Description of the Related Art

For a so-called submicron class MOS transistor having a gate length below 1 μm, the LDD structure reducing electric field concentration near the drain is used for the purpose of preventing degrading of characteristics of the transistor due to injection of hot carriers into a gate oxide film or a bottom part of sidewall by the electric field concentration near the drain.

In a conventional MOS type transistor having the LDD structure, as disclosed, for example, in JP-A-62-290176 (1987) and JP-A-2-117176 (1990), the gate oxide film serving as a dielectric field is formed on a p-conductivity type semiconductor silicon substrate and a gate electrode made of a conductive film such as a polycrystalline silicon film, a transition metal film or a composite film thereof is formed thereon. In the case where a polycrystalline silicon film is used for the gate electrode, impurities such as phosphor and boron are diffused therein in order to reduce the resistance thereof.

Low impurity concentration diffusion layers (n-type layers) are formed in the p-conductivity type semiconductor silicon substrate by injecting by the ion implantation method and diffusing n-conductivity type impurities in portions, where source and drain regions are to be formed, by using the gate electrode as a self-alignment mask.

Then sidewall spacers are formed on both sides of the gate electrode using a film of an insulating material such as silicon dioxide, and high impurity concentration layers (n+ type layers) serving as source and drain regions are formed by injecting by the ion implantation method and diffusing n-conductivity type impurities in portions of the low impurity concentration diffusion layers described above, other than the portions located below the sidewall spacers by using these sidewall spacers as a self-alignment mask.

As described above, in a MOS type semiconductor device having an LDD structure, since the low impurity concentration diffusion layers are formed in the portions of the source and drain regions just below the sidewall spacers, electric field concentration is reduced in these portions.

However, in a conventional MOS type semiconductor device having the LDD structure, use of sidewall spacers made of an insulating film creates a problem since the low impurity concentration layers just below these sidewall spacers act as parasitic resistance between the MOS channel and the high impurity concentration diffusion regions, resulting in degrading conductance characteristics of the transistor.

SUMMARY OF THE INVENTION

The object of the present invention is to improve the conventional MOS type semiconductor device having the LDD structure so as to prevent degrading of MOS transistor characteristics due to injection of hot carriers in the gate oxide film or the bottom part of side wall by electric field concentration near the drain, and also to improve conductance characteristics of the transistor by reducing the resistance in the low impurity concentration diffusion regions just below the sidewall spacers.

According to the present invention, an MOS type semiconductor device having the LDD structure is provided which comprise a silicon substrate of a first conductivity type; an insulating film formed on a main surface of the silicon substrate; a gate electrode made of a conductive material and formed on the insulating film; sidewall spacers made of a conductive material different from the material of the gate electrode and formed at both sides of the gate electrode; and impurity diffusion layers formed in the main surface of the semiconductor substrate at respective regions thereof where source and drain of the MOS type transistor are to be formed, each of the impurity diffusion layers including a low concentration diffusion layer formed in one of the regions at its first portion just below one of the sidewall spacers and a high concentration diffusion layer formed in the one region at its second portion other than the first portion.

In one embodiment of the present invention, each of the sidewall spacers described above is made of a polycrystalline silicon film of first conductivity type and the gate electrode described above is mainly made of a polycrystalline silicon film of second conductivity type.

In another embodiment of the present invention, each of the side wall spacers described above is made of a transition metal or a silicide film and the gate electrode described above is mainly made of a polycrystalline silicon film.

According to the present invention, since the sidewall spacers are made of a conductive material, the low impurity concentration diffusion layers disposed just below the side wall spacers can be held in a charge storing state whereby the parasitic resistance is reduced and the conductance characteristics of the MOS type semiconductor device is improved.

Further carriers injected and trapped in the bottom part of the drain side sidewall spacer can be drawn out therefrom by applying electric field to the side wall spacer and in this way it is possible to prevent degrading of the characteristics peculiar to the LDD transistor.

Further, in the process of making the sidewall spacers, a layer of the material which the sidewall spacers are to be made of is formed, after the gate electrode is formed, so as to cover the gate electrode and a part of the layer is removed by reactive ion etching work so as to retain the side wall spacers of the material. In the present invention, since different materials are used for the sidewall spacers and the gate electrode, respectively, it is possible to make the side wall spacers without damaging the gate electrode in the reactive ion etching work merely by suitably selecting the etching energy.

DESCRIPTION OF THE PREFERRED EMBODIMENTS

Hereinbelow an embodiment of the present invention will be explained, referring to FIGS. 1A to 1D.

Figure 1A:
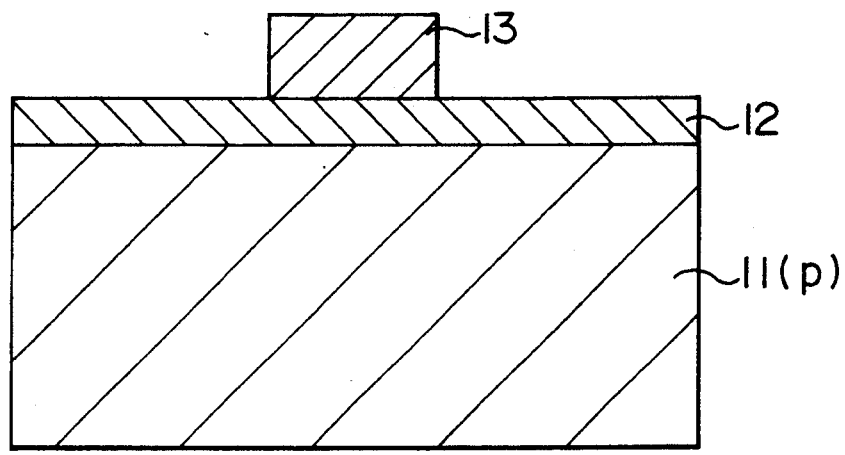
FIGS. 1A to 1D are cross-sectional views showing fabrication steps for an N type MOS transistor according to one embodiment of the present invention.

At first, as indicated in FIG. 1A, a silicon dioxide film 12, serving as a gate oxide film, is formed at a thickness of about 10 to 50 nm on a main surface of a semiconductor silicon substrate 11 of p-conductivity type having a resistivity of about 1 to 10 $\Omega$cm by the thermal oxidation method in an oxygen atmosphere or a steam atmosphere at a temperature of about 700° to 1000° C. The semiconductor silicon substrate is divided into a plurality of element regions, which are element-isolated from each other by a well known technique and one of these element regions is indicated in the figure.

Then, a polycrystalline silicon film used for the gate electrode is formed on the silicon oxide film 12 by the CVD method at a thickness of about 100 to 500 nm and phosphorus ions are introduced in the polycrystalline silicon film by the diffusion method at a concentration of about $10^{19}$ to $10^{21}/cm^3$ for the purpose of decreasing the resistance of the polycrystalline silicon film.

In the case where the resistance should be further decreased, a film (not shown in the figure) of a refractory metal such as tungsten, molybdenum, titanium, etc. is formed further thereon at a thickness of about 100 to 300 nm.

Thereafter, the polycrystalline silicon film and the transition metal film, if any, are patterned by a fine processing technique to form the gate electrode 13.

Figure 1B:
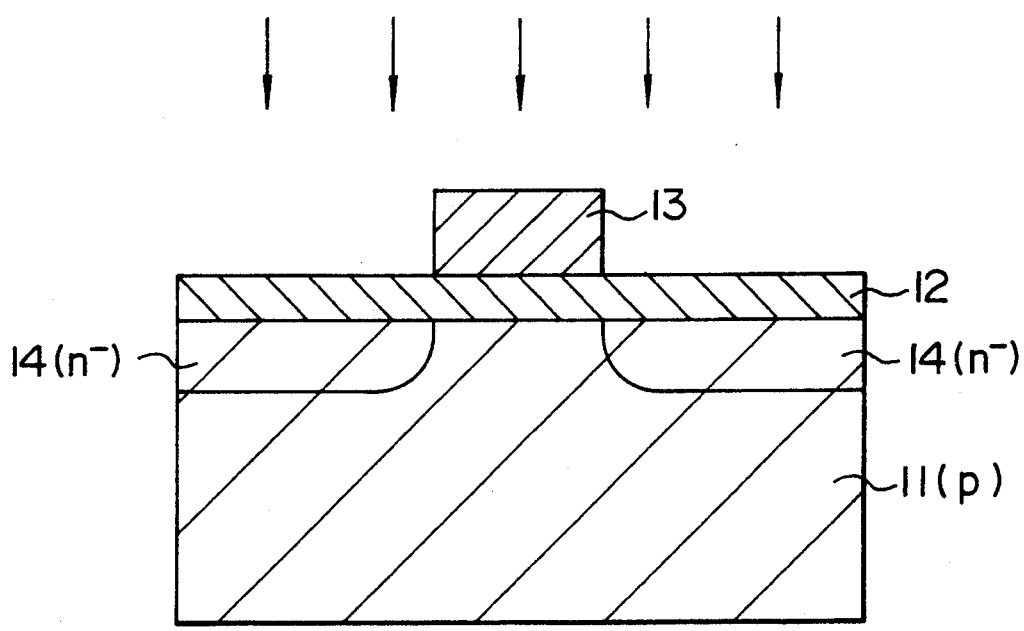

Subsequently, arsenic ions, phosphor ions, or both of the ions in sequence are ion-implanted in regions, where the source and the drain of the MOS transistor are to be formed, on the semiconductor silicon substrate 11 in a direction approximately perpendicular to the main surface of the semiconductor silicon substrate 11 by using the gate electrode 13 as a self-alignment mask, as indicated in FIG. 1B, thereby to form n⁻ type low impurity concentration diffusion layer 14. At the time, the ion-implantation is effected at an energy of 20 to 60 keV and at a dose of about $10^{12}$ to $10^{14}/cm^2$.

Figure 1C:
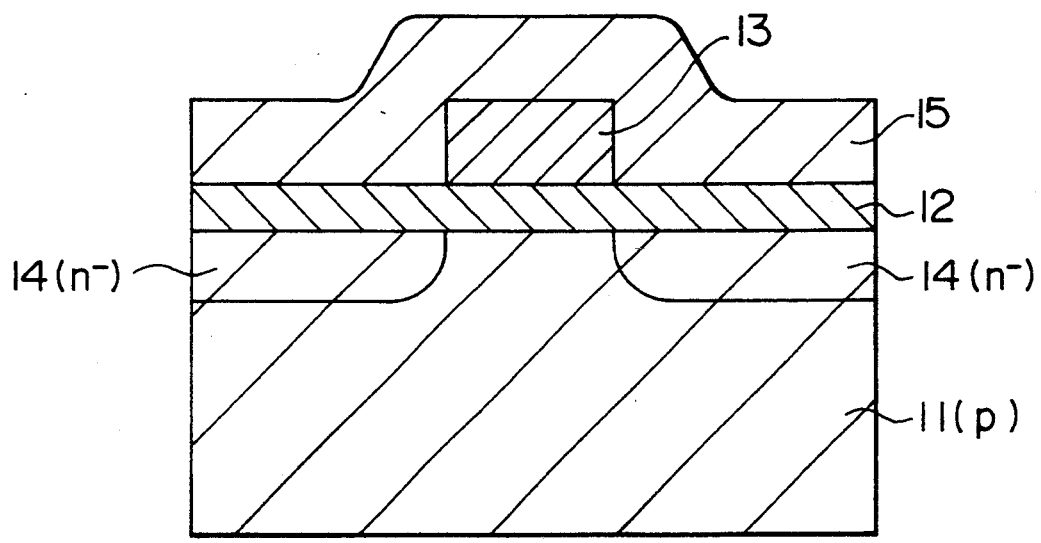

Next, as indicated in FIG. 1C, the transition metal film or the silicide film 15 of molybdenum, tungsten, titanium, etc. is formed at a thickness of about 100 to 600 nm to cover the gate electrode 13 by the CVD method or the sputtering method.

Figure 1D:
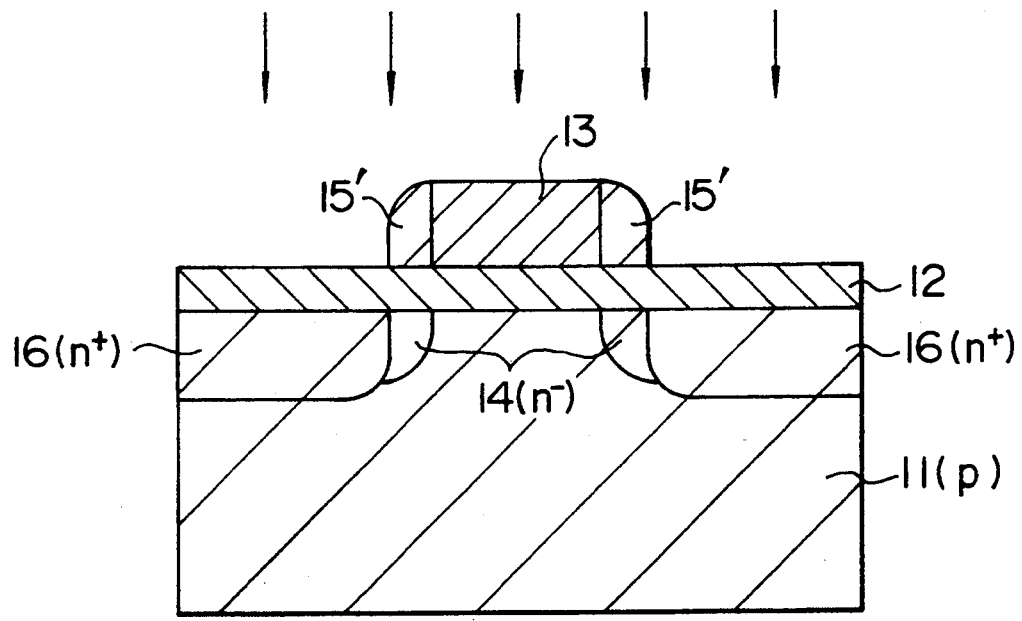

Thereafter, the transition metal film or the silicide film 15 is etched by anisotropic etching using reactive ion etching (IRE) to form sidewall spacers 15' about 0.1–0.4 $\mu$m thick as indicated in FIG. 1D.

Next, arsenic ions are ion-implanted in the semiconductor silicon substrate 11 in a direction approximately perpendicular to the main surface thereof by using the gate electrode 13 and the side wall spacers 15' as a self alignment mask thereby to form n⁺ type high impurity concentration diffusion layers 16 serving as the source and the drain of the MOS transistor. The ion implantation is effected at an energy of about 30 to 60 keV and a dose of about $10^{14}$ to $10^{16}/cm^2$.

Thereafter, an insulating film is formed by the well known chemical vapor deposition (CVD) technique and contact holes for making electric connection are formed by a well-known fine processing technique. Then, a transition metal film is formed by the well-known CVD method or the sputtering method, which film is processed into a desired pattern by the well-known fine processing technique to connect electrically different elements.

Next, another embodiment of the present invention will be described. This embodiment is identical to the first embodiment except that the materials used for the gate electrode and the side wall spacers in this embodiment are different from those used in the first embodiment. In this embodiment, as indicated in FIG. 1A, after having formed a silicon dioxide film 12 on a main surface of a p-conductivity type silicon substrate 11, a polycrystalline silicon film used for the gate electrode is formed further thereon at a thickness of about 100 to 500 nm by the CVD method and phosphorus ions are introduced in the polycrystalline silicon film by the diffusion method at a concentration of about $10^{19}$ to $10^{21}/cm^3$ for the purpose of decreasing the resistance of the polycrystalline silicon film.

In the case where the resistance should be decreased further, a film of a refractory metal such as tungsten, molybdenum, titanium, etc. is formed further thereon at a thickness of about 100 to 300 nm.

Thereafter, the polycrystalline silicon film and the transition metal film, if any, are patterned by the fine processing technique similarly to the first embodiment to form the gate electrode, and as indicated in FIG. 1B, n⁻ type low impurity concentration layers 14 are formed in regions, where the source and the drain of the MOS transistor are to be formed, on the semiconductor silicon substrate 11.

Next, as indicated in FIG. 1C, a polycrystalline silicon film 15 is formed at a thickness of about 200 to 600 nm by the CVD method. Then, boron ions are introduced in the polycrystalline silicon film by the ion implantation method at a concentration of about $10^{18}$ to $10^{20}/cm^3$. At this time, in order to moderate electric field at the p-n junction between the gate electrode 13 and this polycrystalline silicon film 15, the concentration in the film 15 is reduced to 1/10–1/100 of that in the gate electrode 13.

Thereafter, the polycrystalline silicon film 15 is etched by anisotropic etching using RIE to form side wall spacers 15' as indicated in FIG. 1D.

Subsequently, n⁺ type high impurity concentration diffusion layers 16 serving as the source and the drain of the MOS transistor, are formed, as indicated in FIG. 1D, similarly to the first embodiment.

I claim:

1. An MOS type semiconductor device having an LDD structure comprising:
   a silicon substrate of a first conductivity type;
   an insulating film formed on a main surface of said silicon substrate;
   a gate electrode made of polycrystalline silicon containing impurities at a first concentration and formed on said insulating film;
   sidewall spacers made of polycrystalline silicon containing impurities at a second concentration lower than said first concentration and formed at both sides of the gate electrode;
   impurity diffusion layers formed in the main surface of the semiconductor substrate at respective regions thereof where source and drain of the MOS type semiconductor device are to be formed such that the source and drain are spaced from each other with the gate electrode disposed between them, each of the impurity diffusion layers including a low concentration diffusion layer disposed at a first portion of one of the regions just below one of the sidewall spacers and a high concentration diffusion layer disposed at a second portion other than the first portion of the one region; and wherein each of said sidewall spacers is made of a polycrystalline silicon film of the first conductivity type and said gate electrode is made of a polycrystalline silicon film of a second conductivity type different from the first conductivity type.

2. A MOS type semiconductor device according to claim 1, wherein said second concentration is about 1/10 to 1/100 of said first concentration.

3. An MOS type semiconductor device having an LDD structure comprising:
- a silicon substrate of a first conductivity type;
- an insulating film formed on a main surface of said silicon substrate;
- a gate electrode made of polycrystalline silicon containing impurities at a first concentration and formed on said insulating film;
- sidewall spacers made of polycrystalline silicon containing impurities at a second concentration different from said first concentration and formed at both sides of the gate electrode;
- impurity diffusion layers formed in the main surface of the semiconductor substrate at respective regions thereof where source and drain of the MOS type semiconductor device are to be formed such that the source and drain are spaced from each other with the gate electrode disposed between them, each of the impurity diffusion layers including a low concentration diffusion layer disposed at a first portion of one of the regions just below one of the sidewall spacers and a high concentration diffusion layer disposed at a second portion other than the first portion of the one region;
- wherein said second concentration is lower than said first concentration and within a range of about 1/10 to 1/100 of said first concentration; and
- wherein said sidewall spacers are made of a polycrystalline silicon film of the first conductivity type and said gate electrode is mainly made of a polycrystalline silicon film of a second conductivity type different from the first conductivity type.

* * * * *